United States Patent
Niemi et al.

(10) Patent No.: US 10,797,483 B2
(45) Date of Patent: Oct. 6, 2020

(54) TECHNIQUES FOR MANAGING RESOURCE CONSUMPTION FOR DEMAND-BASED METERING

(71) Applicant: LANDIS+GYR INNOVATIONS, INC., Alpharetta, GA (US)

(72) Inventors: Mikko Niemi, Alpharetta, GA (US); David Shaw, Canton, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 174 days.

(21) Appl. No.: 15/879,679

(22) Filed: Jan. 25, 2018

(65) Prior Publication Data
US 2018/0212428 A1   Jul. 26, 2018

Related U.S. Application Data

(60) Provisional application No. 62/450,190, filed on Jan. 25, 2017.

(51) Int. Cl.
*H02J 3/14* (2006.01)
*G06Q 50/06* (2012.01)
(Continued)

(52) U.S. Cl.
CPC ............. *H02J 3/14* (2013.01); *G01R 21/008* (2013.01); *G06Q 10/04* (2013.01); *G06Q 10/06* (2013.01); *G06Q 50/06* (2013.01); *H02J 13/00* (2013.01); *G01D 4/004* (2013.01); *H02J 3/003* (2020.01); *Y02B 70/3225* (2013.01); *Y02B 90/242* (2013.01); *Y02B 90/245* (2013.01); *Y04S 20/222* (2013.01); *Y04S 20/322* (2013.01); *Y04S 20/40* (2013.01)

(58) Field of Classification Search
CPC ........................................................ H02J 3/14
See application file for complete search history.

(56) References Cited

U.S. PATENT DOCUMENTS

| | | |
|---|---|---|
| 2009/0234511 A1 | 9/2009 | Ouchi et al. |
| 2013/0320776 A1 | 12/2013 | Cook |
| 2014/0148925 A1 | 5/2014 | Ahn et al. |

OTHER PUBLICATIONS

9312A Residential Demand Controller, 9312A Controller, Energy Sentry, Available on internet at http://energysentry.com/PP-9312.php, accessed on Jan. 25, 2017, 2 pages.

(Continued)

*Primary Examiner* — Tejal Gami
(74) *Attorney, Agent, or Firm* — Kilpatrick Townsend & Stockton LLP

(57) ABSTRACT

A demand management module may determine a demand interval that is associated with an electrical utility provider. In addition, the demand management module may determine a threshold amount of electricity received by an electrical meter during the demand interval. In some cases, the demand management module may determine a forecasted consumption during the demand interval, for load devices that receive electricity via the meter. Based on a comparison of the forecasted consumption and the threshold, the demand management module may determine whether to control electrical consumption of one or more of the load devices during the demand interval. For example, the demand management module may issue a command to a load managing device to increase or decrease the consumption of the load device.

20 Claims, 3 Drawing Sheets

(51) Int. Cl.
*G01R 21/00* (2006.01)
*H02J 13/00* (2006.01)
*G06Q 10/04* (2012.01)
*G06Q 10/06* (2012.01)
G01D 4/00 (2006.01)
H02J 3/00 (2006.01)

(56) References Cited

OTHER PUBLICATIONS

Computerized Energy Management—Model 9312 Owner's/Installation Manual, Energy Sentry, Brayden Automation, 2009, 33 pages.
International Application No. PCT/US2018/015166, International Search Report and Written Opinion dated Mar. 14, 2018, 15 pages.

DEMANDMANAGERUI

| METER RADIO ID | F07DF9E7 | ☑ ENABLE DM | ☑ RATE A | ☐ RATE D |
| --- | --- | --- | --- | --- |
| DEMAND TARGET | 7.5 kW | ☑ ENABLE EVENTS | ☐ RATE B | ☐ RATE E |
| EVENT DURATION | 30 MINUTES | ☐ ENABLE DEBUG | ☐ RATE C | |
| INTERVAL GUARD TIME | 5 MINUTES | | | |

210

| RADIO ID | 9158D125 | | CONTROL TYPE | DUTY CYCLE |
| --- | --- | --- | --- | --- |
| DEVICE TYPE | TSTAT | | DUTY CYCLE | 0 |
| RELAY ID | 1 | | TEMP OFFSET | 0 |
| LOAD kW | 3.2 | | PRIORITY | 1 |

ADD     UPDATE     DELETE

220

DEVICE LIST

| PRIORITY | RADIO ID | DEVICE TYPE | RELAY ID | LOAD kW | CONTROL TYPE | DUTY CYCLE | TEMP OFFSET |
| --- | --- | --- | --- | --- | --- | --- | --- |
| 1 | 9158D125 | TSTAT | 1 | 3.2 | DUTY CYCLE | 0 | 0 |
| 2 | 9158D1F1 | LCS | | 6.4 | DUTY CYCLE | 0 | 0 |
| 3 | 9158A4A1 | TSTAT | 1 | 2.8 | DUTY CYCLE | 0 | 0 |
| 4 | 9158A635 | LCS | | 2.9 | DUTY CYCLE | 0 | 0 |

SAVE     LOAD     APPLY     GET

TECHNIQUES FOR MANAGING RESOURCE CONSUMPTION FOR DEMAND-BASED METERING

RELATED APPLICATIONS

The present disclosure claims priority to U.S. provisional application Ser. No. 62/450,190 for "Techniques for Managing Resource Consumption for Demand-Based Metering," filed Jan. 25, 2017, which is incorporated by reference herein in its entirety.

TECHNICAL FIELD

This disclosure relates generally to the field of managing consumption of a metered utility, and more specifically relates to adjusting electrical consumption based on a determined demand for electricity.

BACKGROUND

In some instances, electric utility providers meter customer usage based upon the electricity demand of individual customers over defined time intervals (also referred to as "demand intervals"). Often the utility providers bill such customers for their electricity demand using the peak demand value that occurred within a billing period. For example, a residential utility customer whose electricity demand during one 15-minute demand interval was 20 kilowatts (kW), while the demand for each of the remaining demand intervals for the monthly billing period was 5 kW, would be billed for the month using their peak demand level of 20 kW. As a result, it may be advantageous for such customers to manage their electricity demand in order to avoid reaching an unnecessarily large peak demand level.

However, managing demand can be particularly challenging for customers who, in addition to the utility-provided electric power, have additional sources of electric power for their premises, such as photovoltaic solar cells, wind turbine generators, batteries, etc. Unlike the electric power provided by the electric utility, such additional power sources may vary in the amount of electric power that is provided, such as can occur with solar cells on a cloudy day or with a wind turbine during periods with little or no wind. Thus, even if the electricity consumed at a customer premises is steady, the electricity demand placed upon the utility by the customer can vary dramatically as utility-provided power is needed to offset the varying amount of power from the additional source(s). In order to avoid potentially costly peaks in metered demand usage, what is needed is a way to actively manage electricity usage that takes the metered demand into account.

SUMMARY

According to certain implementations, an electrical meter receives electricity from an electrical utility provider. Portions of the electricity are provided to one or more load devices. Each load device may be associated with a load managing device (e.g., a thermostat) that is capable of adjusting the electrical consumption of the load device. In some cases, a demand management module may determine a demand interval and a threshold amount of electricity that is associated with the demand interval. In addition, the demand management module may determine a forecasted consumption of electricity during the demand interval, based on the portions of electricity already received. Based on a comparison of the forecasted consumption with the threshold, the demand management module may issue commands to the load managing devices to adjust the electrical consumption of the associated load devices.

In some implementations, one or more of the demand interval, the threshold, or the forecasted consumption are based on information received from the electrical utility provider, from a user of the demand management module, from the load managing devices, from the load devices, or any combination of these. For example, the demand interval may be determined based on information received from a computer system associated with the electrical utility provider. In addition, the threshold may be determined based on configuration information received via a user interface associated with the demand management module. Furthermore, the forecasted consumption may be determined based on an electricity request from the load device or load managing device.

These illustrative aspects are mentioned not to limit or define the disclosure, but to provide examples to aid understanding thereof. Additional aspects are discussed in the Detailed Description, and further description is provided there.

DESCRIPTION OF THE DRAWINGS

Features, aspects, and advantages of the present disclosure are better understood when the following Detailed Description is read with reference to the accompanying drawings, where:

FIG. 2 is a diagram depicting an example of a user interface by which a utility customer may configure the electricity demand management functionality of a meter, according to certain aspects.

DETAILED DESCRIPTION

Embodiments of the present invention are generally directed to a meter that manages electricity usage for a utility customer based on the metered demand. In an exemplary embodiment, an electricity meter determines a value for a customer's electricity demand during defined demand intervals using a demand management module or other logic executing in the electricity meter (sometimes referred to as a "Demand Manager" module). In the event that that the demand exceeds a limit that the customer has set, the meter will start reducing (e.g., "shedding") the electrical load by issuing corresponding commands to the customer's load managing devices, such as thermostats and load control switches. Once the meter has issued one or more load-reducing commands, it monitors the resulting electricity demand to determine if the demand has been reduced to a level to stay within the customer-configured limits for the demand interval. If the electricity demand still exceeds the limit (or is forecasted to exceed the limit), the meter issues additional load-reducing commands to further reduce the customer's electricity demand for utility-provided electric power. In some instances, a customer's demand for utility-provided electric power is determined not only by their amount of electricity consumption, but also by the amount of electricity supplied to their premises by additional power sources, such as photovoltaic solar cells, wind turbine generators, batteries, etc. In some embodiments, the meter measures demand and usage that is in excess of the electrical power supplied by the additional power sources (sometimes referred to as "net demand" and "net usage," respectively).

Figure 1:
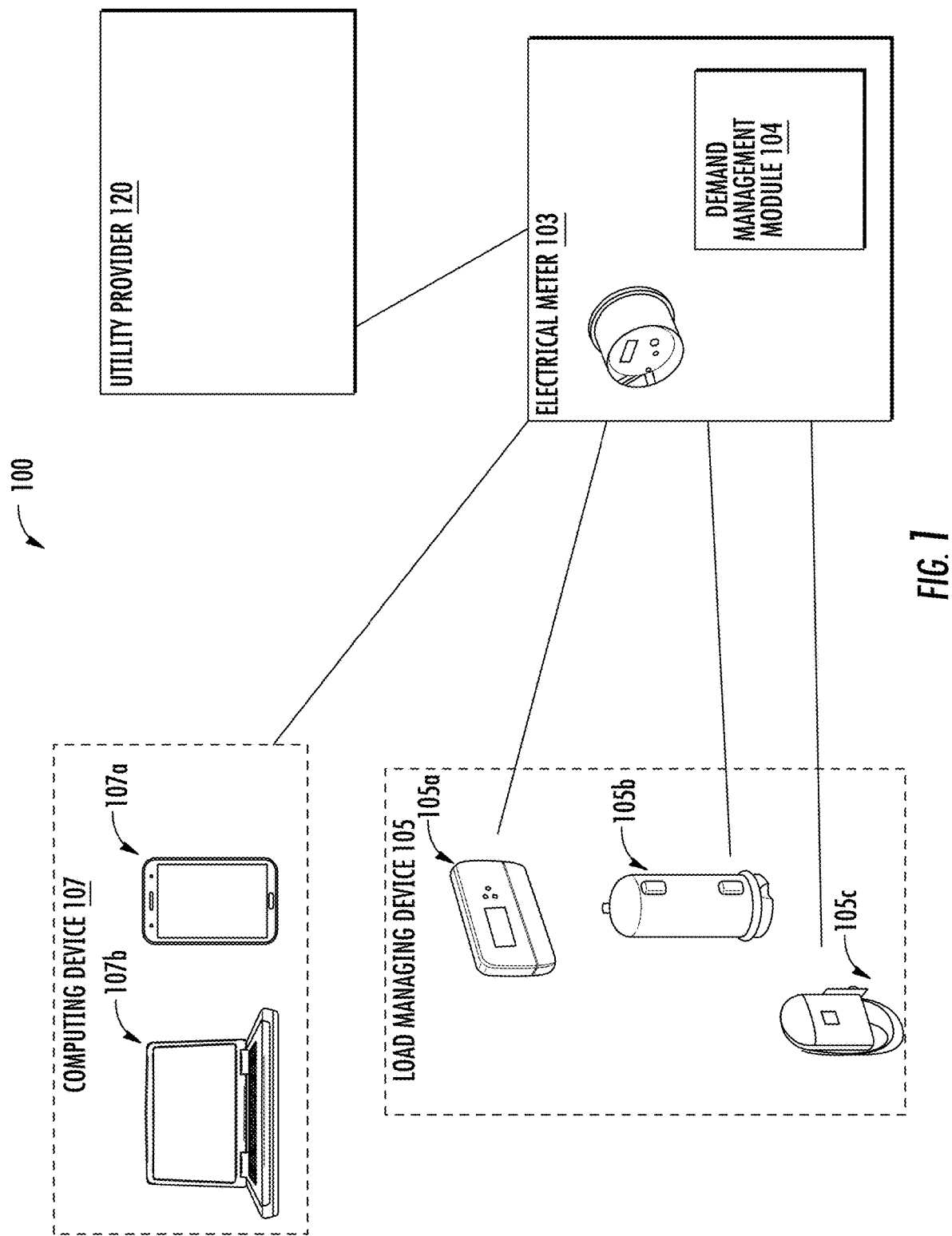
FIG. 1 is a block diagram depicting an example of a metered environment in which a utility customer can manage her or his electricity demand, according to certain aspects.

With reference to FIG. 1, shown is an exemplary metered environment 100 in which a utility customer can manage her or his electricity demand. The metered environment 100 includes an electricity meter 103 that meters electricity demand and usage for a customer premises. In the metered environment 100, the electrical meter 103 also includes a demand management module 104, but other implementations are possible. For example, the demand management module 104 may be included in one or more devices associated with the utility provider 120 (e.g., a server, a transformer, an electrical substation), and the meter 103 may access the demand management module 104 via one or more networks. In some cases, the demand management module 104 may include one or more components (such as module of a computer application or a processor programmed with code instructions) to enable operations related to demand management.

The metered environment 100 also includes various electrical load managing devices 105, such as a thermostat 105a and load control switches 105b and 105c, that are capable of adjusting (i.e., shedding and/or restoring) electricity usage of other on-premises devices that affect demand. For example, the thermostat 105a may manage temperature set points and other operating modes of a heat pump for a home, while a load control switch 105b-c may manage operation of a vehicle charger, clothes dryer, water heater, etc. The load managing devices 105 can receive commands from the meter 103 to shed and/or restore electrical load. The meter may communicate with the load managing devices 105 using Wi-Fi; radio frequency (RF) mesh networking, such as defined by ZigBee and/or IEEE 802.15.4; Z-Wave; Power-line Communication (PLC); and/or other communication technologies and protocols. In some embodiments, the metered environment 100 also includes additional power sources (not shown), such as photovoltaic solar cells, wind turbine generators, batteries, etc., that provide power for a customer premises, in addition to the utility-provided power that is metered by the meter 103. In still other embodiments, a metering device that implements a demand management module 104, such as the meter 103, may be placed at the transformer level of the utility provider, thereby enabling electricity demand management for one or more customers within a geographic area.

A utility customer may manage configuration of the electricity demand management functionality of the meter 103 using a computing device 107, such as a smartphone 107a, laptop computer 107b, or any other suitable computing device. The computing device 107 may communicate directly with the meter 103 via Wi-Fi and/or other communication protocols, or the customer may configure their meter 103 indirectly via a computing interface implemented via one or more additional computing systems, including remote computing systems (e.g., a cloud-based interface). An electric utility provider 120 may also communicate with the meter 103 to obtain and/or configure various data on the meter, such as data associated with electricity usage and demand. For example, the utility provider 120 may configure the length of demand intervals (e.g., 15 minutes, 30 minutes, or 60 minutes) during which electricity demand for a customer is evaluated, the various billing rates that correspond to when and/or how demand should be tracked, how demand is to be billed, or other suitable characteristics. For instance, a first billing rate may correspond to demand-based pricing and the utility provider 120 schedules the first rate to be in effect from 5 P.M. to 10 P.M. Monday-Friday, whereas the remainder of the time a second billing rate is in effect whereby electricity is billed based on usage and demand is not considered. When the utility provider 120 seeks to change schedules or other aspects associated with customer billing, this data is stored by the meter 103 where the data may be used to inform electricity demand/usage decisions according to the portion of the configuration made by the customer.

Shown in FIG. 2 is an exemplary user interface 200 for a module (such as the demand management module 104) by which a utility customer may configure the electricity demand management functionality of their meter 103 using a computing device 107. The user interface 200 may provide graphical elements that display or control aspects of the meter 103, the demand management module 104, or the load managing devices 105. For example, the user interface 200 may provide one or more metering parameters 210. The metering parameters 210 may display or control aspects related to management of the metered utility, such as parameters related to identification of the meter 103, setting a demand threshold, or enabling demand management for one or more types of demand intervals. In addition, the user interface 200 may provide one or more load management parameters 220. The load management parameters 220 may display or control aspects related to the load managing devices 105, such as parameters related to identification of one or more load managing devices 105, describing a load device that is associated with (e.g., managed by) a load managing device 105, or setting a priority of a device 105.

In some implementations, a portion of the parameters shown in the user interface 200 may be configured by the utility provider 120. For example, the utility provider 120 may configure a radio identification for the meter 103, or information about a billing rate. Additionally or alternatively, some parameters shown in the user interface 200 may be configurable by the customer. For example, the customer may configure a radio identification of a load managing device 105. Table 1, presented below, further describes some possible parameters for a demand management module, such as metering parameters 210 presented in the user interface. The parameters, descriptions, and values included in Table 1 are exemplary, and should not be considered limiting.

TABLE 1

| Parameter | Description |
|---|---|
| Meter Radio ID | The radio identification of the meter running Demand Manager. |
| Demand Target | Specifies the forecasted demand threshold at which Demand Manager will shed load.<br>In addition, Demand Manager will cancel load control for a device if it calculates the forecasted demand will |

TABLE 1-continued

| Parameter | Description |
|---|---|
|  | remain below the target with the load re-enabled (utilizing the device's "Load kW" value). |
| Event Duration (also referred to as Demand Interval) | Specifies the duration for the load shed command. An example value is 15, 30, or 60 minutes. May be set by the utility provider or adjusted/specified by a customer for demand management purposes. |
| Interval Guard Time | Specifies the length of time at the start of each interval during which Demand Manager will not consider shedding load. An example value is 5 minutes. |
| Enable DM | Enables the Demand Manager feature in the meter. |
| Enable Events | Enables the reporting of events in Demand Manager. Events are generated and sent after a load control command is issued to a device. |
| Enable Debug | Enables the reporting of debug messaging in Demand Manager. The debug message is sent every 20 seconds from the meter to Load Control Shop to indicate the operational status of the Demand Manager module. |
| Enable Rate A, B, C, D, E | Specifies for which rates in the meter that Demand Manager should actively control demand. Details about each rate, such as schedule (days, times, etc.) and pricing, may be defined by the utility provider and may be updated periodically. The meter can utilize the most current rate information configured by the utility provider for performing demand management functions. |

In some cases, the user interface 200 may indicate a set of one or more load devices that are available for consumption management. For example, a device list 230 indicates multiple load managing devices, such as load managing devices 105, which may receive commands from the demand management module 104. In the example user interface 200, selection of an indicated load managing device in the device list 230 may allow configuration of parameters related to the selected device, such as the load management parameters 220. In addition, the device list 230 may list the present parameter values for additional load managing devices. For example, the device list 230 may list each load managing device according to a respective priority.

Table 2 below further describes possible parameters for load managing devices, such as load management parameters 220, that may be managed by the meter 103 to shed and/or restore electrical load. The parameters, descriptions, and values included in Table 2 are exemplary, and should not be considered limiting.

TABLE 2

| Device Parameters | Description |
|---|---|
| Radio ID | The 4 byte serial number of the single-board radio in the load managing device. |
| Device Type | Example supported types: TSTAT—Thermostat LCS—Load Control Switch |
| Relay ID | Specifies the relay to be configured on a load control switch Example supported values: For Thermostat - always 1 For LCS - 1 or 2 |
| Load kW | Specifies the size of the load under control in kW. Optionally, the Load kW value may be adjusted based on the duration of the demand interval (e.g., expressed in kW consumed during a 30 minute demand interval). This value will be used by Demand Manager to determine if an active load shed (e.g., a device that is requesting energy, but is presently managed to reduce consumption) can be canceled for the device (e.g., no longer presently managed to reduce consumption) and still maintain the demand target. |

TABLE 2-continued

| Device Parameters | Description |
|---|---|
| Control Type | Specifies the type of load control when shedding load Supported Types: Duty Cycle - Shed load using duty cycle method Temp Offset - Shed load using temperature offset method |
| Duty Cycle | Specifies the maximum operational duty cycle of the device when shedding load with the "Duty Cycle" control type. Examples: Duty Cycle of "0" indicates that the load will remain off for the duration of the event. Duty Cycle of "70" specifies that the load will be allowed to run for at most 70% of the event duration. This value is ignored for the "Temp Offset" control type. |
| Temp Offset | Specifies the set point offset adjustment in degrees F when shedding load with the "Temp Offset" control type. The value of the Temp Offset may be determined based on a type of temperature control used (e.g., offset value is +5 degrees when air conditioning is in use, offset value is −5 degrees when heat is in use). This value is ignored for the "Duty Cycle" control type. |
| Priority | Specifies the order in which loads should be shed. For example, priority 1 is shed first. Typical values: 1 to 16 |

Figure 3:
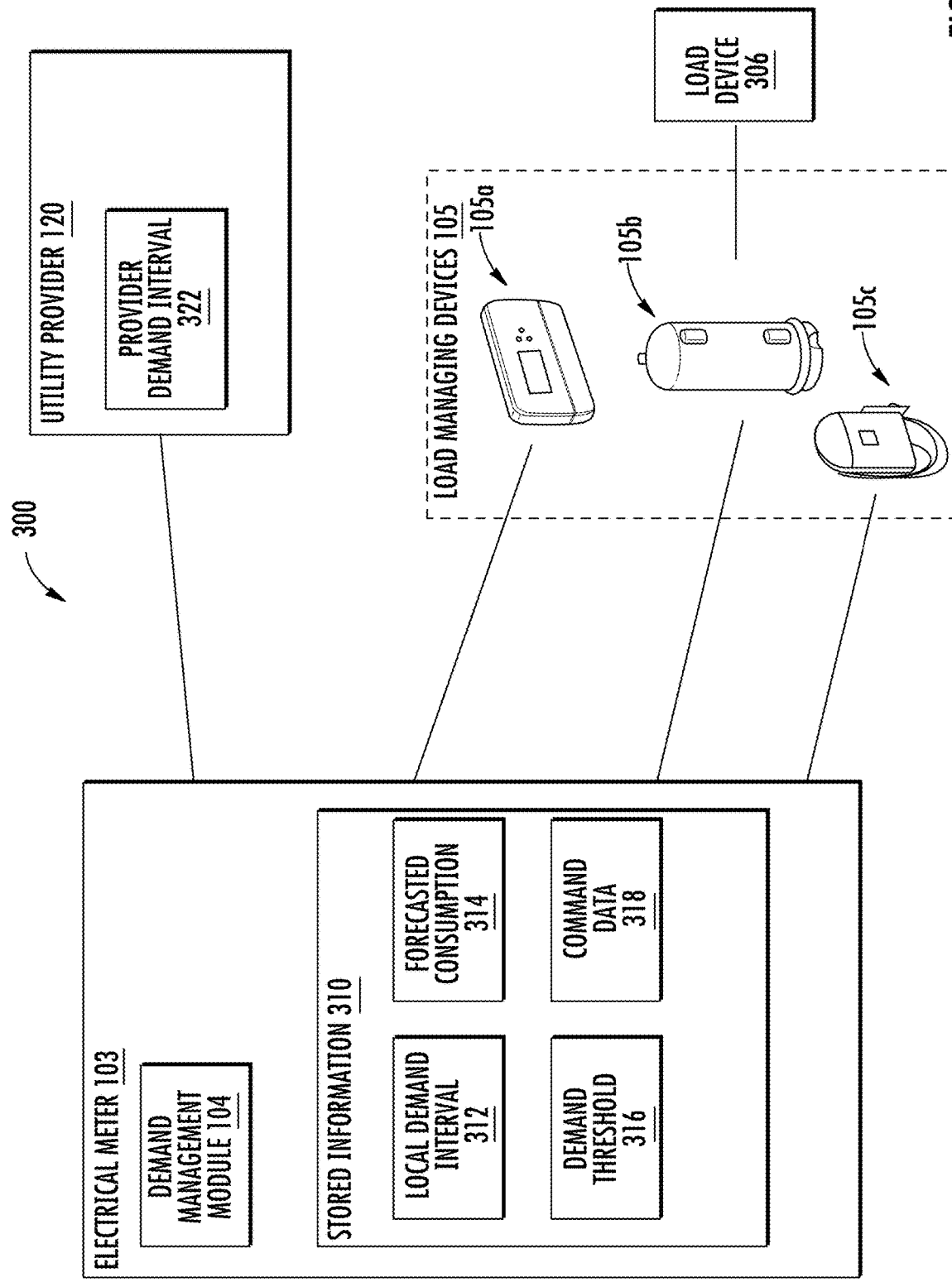
FIG. 3 is a block diagram depicting an example of an environment in which information associated with electricity usage and demand may be stored, and electricity usage decisions or electricity demand management decisions may be performed based on the stored information, according to certain aspects.

In some implementations, the meter 103 may store information associated with electricity usage and demand locally, such as in a memory component that is included in (or accessible by) the meter 103. FIG. 3 depicts an exemplary environment 300 in which a meter, such as meter 103, stores information associated with electricity usage and demand. The meter 103, or the demand management module 104, or both, may inform electricity usage decisions or electricity demand management decisions based on the stored information. The information, such as locally stored information 310, may be stored in a memory component that is included in the meter 103, but other implementations are possible. For example, the information 310 may be stored in an additional device, such as one or more of the load managing devices 105 or a separate device including the demand management module 104, and the meter 103 or the demand management module 104 may access the stored information 310 via a communication with the additional device. In the environment 300, the meter 103 is described as receiving or storing information, or providing command information, but other implementations are possible. For example, the demand management module 104 may receive or store information, or provide command information, or any other suitable operation.

The locally stored information 310 may include data describing one or more local demand intervals 312, such as data indicating a start time, a duration, a billing rate, an indication of demand-based pricing, or any other suitable data describing a local demand interval 312. In some cases, the meter 103 modifies the locally stored information 310 based on information that is provided or configured by the utility provider 120. For example, the meter 103 may receive, such as via one or more networks, information describing a demand interval associated with the utility provider 120, such as provider demand interval 322. The meter 103 and the utility provider 120 may communicate via wireless or wired networks; hypertext transfer protocols (HTTP) or HTTP secure (HTTPS); radio frequency (RF) mesh networking, such as defined by ZigBee and/or IEEE 802.15.4; Z-Wave; Power-line Communication (PLC); or any other suitable communication technology or protocol.

Responsive to receiving the information describing the provider demand interval 322, the meter 103 may modify the locally stored information 310 describing the local demand interval 312. For example, the meter 103 may modify the duration, start time, billing rate, or other data for the local demand interval 312 based on, respectively, the duration, start time, billing rate, or other data for the provider demand interval 322. In some cases, the local duration, local start time, local billing rate, or other local data may match or equal, respectively, the provider duration, provider start time, provider billing rate, or other provider data. Using a local demand interval that matches or equals a provider demand interval may allow the meter 103 to correctly identify a billing rate or other data associated with the electricity measured by the meter 103. In addition, the correct identification of the data associated with the measured electricity may improve the accuracy of electricity usage decisions or electricity demand management decisions performed by one or more of the meter 103 or the demand management module 104.

In some implementations, the stored information 310 may be used to inform one or more of electricity usage decisions or electricity demand management decisions. For example, the meter 103, the demand management module 104, or both may perform demand management operations based on the stored information 310. In addition, the electricity usage decisions or the electricity demand management decisions may be informed based on a combination of the information received from the utility provider 120 and information describing configurations made by the customer, such as via the user interface 200. For example, the demand management operations may be performed based on information received from the utility provider 120, such as provider demand interval 322 data, combined with information describing parameters configured via the user interface 200, such as a Demand Target parameter (e.g., described in Table 1) or a Priority parameter (e.g., described in Table 2).

In some implementations, the meter 103 may determine an amount of energy that is received from the utility provider 120. Based on the local demand interval 312 (e.g., a start time, a duration), the meter 103 may determine that a portion of the received energy is received during the local demand interval 312. In addition, the meter 103 may determine that the portion is received during a present demand interval (e.g., the local demand interval 312 is occurring at the present time). In some cases, the portion of energy may be associated with a particular load device 306 that is associated with a respective one of load managing devices 105, such as load control switch 105b.

In addition, the demand management module 104 may determine a forecasted consumption 314 for a remainder of the present local demand interval. For example, the forecasted consumption 314 may be based on the portion of energy received during the local demand interval 312 and a quantity of time remaining in the duration of the local demand interval 312. The demand management module 104 may determine that the forecasted consumption 314 exceeds a demand threshold 316 (e.g., Demand Target, as described in Table 1), based on a comparison of the forecasted consumption 314 with the demand threshold 316. In environment 300, the forecasted consumption 314 and the demand threshold 316 are each included in the locally stored information 310, but other implementations are possible.

In some implementations, the meter 103 may issue one or more commands based on the determination that the forecasted consumption exceeds the demand threshold. For example, the meter 103 may provide command data 318 to one or more of the load managing devices 105. The command data 318 may include data describing an adjustment of electrical consumption of the load device associated with a respective one of load managing devices 105. For example, responsive to the determination that the forecasted consumption 314 exceeds the demand threshold 316, the meter 103 may provide the command data 318 to load managing device 105b, indicating a reduction in consumption of the load device 306. An example scenario in which the command data 318 indicates a reduction in consumption is described in the "Use Case: Load shed when Demand Forecast>Demand Target," as described below, but other scenarios are possible.

In some implementations, the meter 103 may cease or adjust control of a load device's energy consumption. For example, the demand management module 104 may determine that the forecasted consumption 314 is within, or equals, the demand threshold 316, based on a comparison of the forecasted consumption 314 with the demand threshold 316. In addition, the demand management module 104 may determine that an amount of energy requested by a load device (e.g., Load kW, as described in Table 2) is equivalent or less than a difference between the demand threshold 316 and the forecasted consumption 314. For example, responsive to determining that the energy requested by the load device 306 is equivalent or less than a difference between the demand threshold 316 and the forecasted consumption 314, the meter 103, the demand management module 104, or both, may cease or adjust control of the consumption on the load device 306. In addition, at the end of a demand interval, the meter 103 or the demand management module 104 may cease or adjust consumption control. For example, the meter 103 may cease consumption control and determine a forecasted consumption 314 for the next demand interval based on the unadjusted consumption of the load device 306.

In some cases, responsive to the determination that the forecasted consumption 314 equals or is within the demand threshold 316, the meter 103, the demand management module 104, or both, may provide the command data 318 to load managing device 105b, indicating that an increase in consumption of the load device 306 is permitted. An example scenario in which the command data 318 indicates an increase in consumption is described in the "Use Case: Load restoration when Demand Forecast<Demand Target," as described below, but other scenarios are possible.

Example Calculations to Determine Forecasted Demand

In some embodiments, when the meter 103 is appropriately configured, the demand management module 104 will make decisions to shed or restore electrical load based on the results of the calculated forecasted demand and the configured demand target. In some cases, inputs to this calculation may include the following metrics, which may be provided by a metrology module in the meter 103:

CurrentDemandKWH—Total energy accumulated in the present demand interval (for example, in kilowatt-hours).

InstantaneousKW—Current instantaneous power measured by the meter (for example, in kilowatts).

IntervalLength—Demand interval length (for example, in seconds).

TimeLeft—Amount of time remaining in the demand interval (for example, in seconds).

Equation 1 describes an example equation for determining a forecasted demand, such as DemandForecastKW.

$$DemandForecastKW = \\ \frac{CurrentDemandKWH * 3600}{(IntervalLength - TimeLeft)} * \frac{(IntervalLength - TimeLeft)}{IntevalLength} + \\ InstantKW * \frac{TimeLeft}{IntervalLength}$$

Eq. 1

In addition, Equation 1 may be simplified to a form described by Equation 2.

$$DemandForecastKW = \\ \frac{(CurrentDemandKWH * 3600) + (InstantKW * TimeLeft)}{IntevalLength}$$

Eq. 2

In Equation 2, the forecasted demand estimates the demand value for the present demand interval, taking into account the demand thus far for the interval and assuming the instantaneous demand will continue for the remainder of the interval. It should be noted that in some embodiments, the meter 103 can make decisions based on additional demand values, such as instantaneous demand.

Examples of Scenarios for Managing Electricity Demand

Below are exemplary scenarios and/or use cases for an electrical meter, such as the meter 103, that is configured for managing electricity demand, such as via the demand management module 104. The exemplary scenarios may calculate a forecasted demand based on one or more of Equation 1 or Equation 2. In addition, the exemplary scenarios describe techniques for managing electricity demand under the configuration described in Table 3. The parameter names included in Table 3 may be associated, for example, with graphical elements included in user interface 200, such as one or more of the metering parameters 210 or load management parameters 220. The parameters, names, and values included in Table 3 are exemplary, and should not be considered limiting.

TABLE 3

| Parameter Name | Parameter Value |
| --- | --- |
| Demand Target | 10 kW |
| Rate Flags | Rate A enabled, Rates B-E not enabled |
| Interval Guard Time | 5 minutes |
| Load1 kW, Load1 Priority | 3 kW, 1 |
| Load2 kW, Load2 Priority | 4 kW, 2 |
| Load3 kW, Load3 Priority | 8 kW, 3 |
| Load4 kW, Load4 Priority | 2 kW, 4 |
| Meter Demand Interval Duration | 30 minutes |

In addition, the demand management module 104 may include one or more operations related to determining whether to actively manage demand (e.g., by shedding or restoring loads). For example, the demand management module 104 may determine whether or not to implement operations for one or more of calculating a forecasted consumption, shedding a load, or restoring a load, based on, for example, an input to the user interface 200. Additionally or alternatively, the demand management module 104 may determine whether to actively manage demand based on the following exemplary configurable values:

Demand Target—Specifies the desired kW demand value to which Demand Manager should manage via shed and restoration of loads.

Interval Guard Time—Specifies the length of time at the start of each interval during which Demand Manager will not consider shedding load.

Control Event Length—Specifies the default length of time that demand manager will issue events when controlling load.

Load kW—Specifies the amount of demand (per demand interval) for each load configured to demand manager. Demand manager utilizes this value to determine if restoring a load will still maintain the demand forecast below demand target.

Rate Flags—Specifies during which rate periods that Demand Manager should consider shedding load.

Use Case: No Load Shed During Disabled Rate Periods

Conditions

Meter is currently accumulating for billing Rate B.

Demand Forecast is 12 kW.

Example Behavior

Demand Manager will not shed load even though Demand Forecast>Demand Target since Rate B is not enabled for Demand Manager.

Comments: Rate B may describe a demand interval in which metered electricity is billed based on consumption only, not on demand. In such cases, the demand management module 104 may not compare the forecasted demand with the demand threshold, or may perform the comparison without issuing commands to adjust load.

Use Case: No Load Shed when Demand Forecast<Demand Target

Conditions

Meter is currently accumulating for billing Rate A.

Demand Forecast is 8 kW and remains<Demand Target during the interval.

Example Behavior

Demand Manager will not shed load because Demand Forecast<Demand Target.

Comments: Rate A may describe a demand interval in which metered electricity is billed based on demand and consumption. In such cases, the demand management module 104 may perform the comparison between the forecasted demand and the demand threshold. If the forecasted demand is less than the demand threshold, the demand management module 104 may not issue commands to adjust load.

Use Case: No Load Shed when Demand Forecast>Demand Target During Interval Guard Time
Conditions
Meter is currently accumulating for billing Rate A.
Demand Forecast is 12 kW at 3 minutes into interval.
Demand Forecast becomes 9 kW at 5 minutes into the interval.
Demand Forecast remains below Demand Target for remainder of interval.
Example Behavior
Demand Manager will not shed load even though Demand Forecast>Demand Target, as this occurred only during the Interval Guard Time (during which the Demand Forecast can exceed the Demand Target without load being shed).
Comments: The demand management module 104 may perform multiple comparisons between the forecasted demand and the demand threshold, such as during and after an initial "guard time" at the beginning of a demand interval. Responsive to determining that the forecasted demand after the guard time is below the demand threshold, the demand management module 104 may not issue commands to adjust load.

Use Case: Load Shed when Demand Forecast>Demand Target
Conditions
Meter is currently accumulating for billing Rate A.
Demand Forecast is 9 kW at 5 minutes into interval.
Demand Forecast becomes 14 kW at 10 minutes into the interval.
Example Behavior
Demand Manager will shed Load1 at 10:00 into the interval, based on priority of Load1 (e.g., priority 1).
Demand Manager will see Demand Forecast drops to 12 kW at 10:10 into interval. Calculation:
ForecastedDemand—Load1 (adjusted by remainder of Demand Interval duration)=14 kW−3 kW*(19:50 min/30 min)=12 kW
Demand Manager will shed Load2 at 10:20 into the interval, based on priority of Load2 (e.g., priority 2).
Demand Manager will see Demand Forecast drops to 9.3 kW at 10:30 into interval. Calculation:
ForecastedDemand—Load2 (adjusted by remainder of Demand Interval duration)=12 kW−4 kW*(19:30 min/30 min)=9.3 kW
Demand Manager will not shed any more load as long as Demand Forecast remains below Demand Target for the remainder of the interval.
The shed loads may automatically exit the load control 30 minutes after the load shed started.
Comments: The demand management module 104 may perform multiple comparisons between the forecasted demand and the demand threshold during a demand interval. Responsive to a first comparison in which the forecasted demand exceeds the demand threshold (e.g., at 10:00 into the interval), the demand management module 104 may issue commands to adjust a first load. Responsive to a second comparison in which the forecasted demand exceeds the demand threshold (e.g., at 10:20 into the interval), the demand management module may issue commands to adjust a second load.

Use Case: Load Restoration when Demand Forecast<Demand Target
Conditions
Meter is currently accumulating for billing Rate A.
Demand Forecast had put all four loads into control due to exceeding demand target.
Demand Forecast remains at 9 kW throughout the interval.
Example Behavior
Demand Manager will continually be evaluating whether restoration of load(s) will maintain the demand target constraint.
At 10:00 into the interval none of the loads can be restored. Calculations (loads are adjusted by remainder of Demand Interval duration):
ForecastedDemand+Load1=9 kW+3 kW*(20 min/30 min)=11.0 kW
ForecastedDemand+Load2=9 kW+4 kW*(20 min/30 min)=11.6 kW
ForecastedDemand+Load3=9 kW+8 kW*(20 min/30 min)=14.3 kW
ForecastedDemand+Load4=9 kW+5 kW*(20 min/30 min)=12.3 kW
At 15:00 into the interval none of the loads can be restored. Calculations (loads are adjusted by remainder of Demand Interval duration):
ForecastedDemand+Load1=9 kW+3 kW*(15 min/30 min)=10.5 kW
ForecastedDemand+Load2=9 kW+4 kW*(15 min/30 min)=11.0 kW
ForecastedDemand+Load3=9 kW+8 kW*(15 min/30 min)=13 kW
ForecastedDemand+Load4=9 kW+5 kW*(15 min/30 min)=11.5 kW
At 21:00 into the interval, Demand Manager will determine that Load1 can be restored. Calculations (loads are adjusted by remainder of Demand Interval duration):
ForecastedDemand+Load1=9 kW+3 kW*(9 min/30 min)=9.9 kW
ForecastedDemand+Load2=9 kW+4 kW*(9 min/30 min)=10.2 kW
ForecastedDemand+Load3=9 kW+8 kW*(9 min/30 min)=11.4 kW
ForecastedDemand+Load4=9 kW+5 kW*(9 min/30 min)=10.5 kW
At 21:00 the Demand Manager will end the control event on Load1.
At 21:10 the Demand Manager will see Demand Forecast increased to 9.9 kW. Calculations (load is adjusted by remainder of Demand Interval duration):
ForecastedDemand+Load1=9 kW+3 kW*(8:50 min/30 min)=9.9 kW
Comments: The demand management module 104 may perform multiple comparisons between the demand threshold and a sum of the forecasted demand and an adjusted load during a demand interval. Responsive to a first comparison in which the sum of the forecasted demand and an adjusted load exceeds the demand threshold (e.g., at 10:00 or 15:00 into the interval), the demand management module 104 may not issue commands to restore any loads (or may issue commands to continue at reduced loads). Responsive to a second comparison in which the sum of the forecasted demand and an adjusted load is within the demand threshold (e.g., at 21:00 into the interval), the demand management module may issue commands to restore the adjusted load, such as by increasing consumption of the adjusted load.

To generalize the above use cases, an exemplary meter 103 may perform the various tasks of Demand Manager using programmed instructions included in a non-transitory medium, or other operations related to determining whether to actively manage demand. Table 4, presented below, further describes some possible operations for a demand management module. The operations, descriptions, and values included in Table 4 are exemplary, and should not be considered limiting.

TABLE 4

| Tasks | Frequency |
|---|---|
| Evaluate Demand<br>    Creates a Forecasted Demand value derived from the<br>    following meter read data:<br>        watthours accumulated in the current demand interval<br>        Instantaneous kW<br>        time remaining in the interval<br>        Programmed demand interval size.<br>    Forecasted Demand mathematically is equivalent to the<br>    interval's demand if the current instantaneous demand<br>    remained constant for the remainder of the demand interval.<br>    The direction of the power flow is known to the meter. The<br>    meter does not accumulate energy in the demand register<br>    whenever the meter is receiving energy. Likewise, the<br>    Forecasted Demand will reflect negative kW as an<br>    instantaneous power of zero.<br>    If Forecasted Demand > Demand Target then Demand<br>    Manager will:<br>        Enable task to shed load<br>        Disable task to cancel shed load<br>    If Forecasted Demand < Demand Target then Demand<br>    Manager will:<br>        Enable task to cancel shed load<br>        Disable task to shed load | Every 20 seconds |
| Shed Load<br>    While this task is active and if the current rate is enabled in<br>    the Demand Manager configuration, Demand Manager will<br>    send a load shed command to the next device in the load<br>    managing device list that is not currently shedding load<br>    Selects devices in priority order<br>    Delays at least 30 seconds between each load shed command<br>    allowing for time to re-evaluate the Forecasted Demand<br>    before issuing subsequent load commands<br>    The Demand Manager configuration specifies the parameters<br>    in the load control command (duration, relay ID, duty cycle/<br>    temp offset) | Evaluates every 30 seconds |
| Cancel Shed Load<br>    While this task is active, Demand Manager will cancel load<br>    shed to devices if<br>        The device is in control<br>        A calculation of forecasted demand with the load<br>        active (using the configured load kW value) is still<br>        below the demand target<br>    Selects devices in reverse priority order<br>    Delays at least 30 seconds between each load cancel<br>    command | Evaluates every 30 seconds |
| Send Debug Message<br>    If enabled in the Demand Manager configuration, this<br>    message is sent to a head-end system associated with the<br>    utility provider whenever the Demand Forecast is evaluated | Every 20 seconds |
| Send Event Message<br>    If enabled in the configuration, this message is sent to the<br>    head-end system after load control command is executed | After every load control command |

When the meter 103 is configured to generate event messages, the messages may contain information. Table 5, presented below, describes some possible messages generated by a meter, or information included in such messages. The messages, descriptions, and values included in Table 5 are exemplary, and should not be considered limiting.

TABLE 5

| Element | Description |
| --- | --- |
| Timestamp | Timestamp when the event record was created. Example value: 1 second resolution |
| Event Log ID | Event Record Counter value. Incremented for each created event log record |
| Event Reason | Specifies the reason for the event record. Example values:<br>DM_EVENTREASON_STARTDRLC    1<br>DM_EVENTREASON_STOPDRLC    2<br>DM_EVENTREASON_INTERVAL    3 |
| Pre-Time Remaining | Prior to issuing the load control command, the time remaining in seconds for the demand interval |
| Pre-Forecast Demand | Prior to issuing the load control command, the calculated forecast demand in watts. |
| Pre-Instantaneous kW | Prior to issuing the load control command, the measured instantaneous kW measured by the meter in watts. |
| Post-Time Remaining | Subsequent to issuing the load control command, the time remaining in seconds for the demand interval |
| Post-Forecast Demand | Subsequent to issuing the load control command, the calculated forecast demand in watts. |
| Post-Instantaneous kW | Subsequent to issuing the load control command, the measured instantaneous kW measured by the meter in watts. |
| CE Flags | Indicates which devices are currently in control. Two byte mask. Example values: 0x01 = Device 1, 0x02 = Device2, etc. |
| Demand Target | The currently configured demand target in watts |
| Event Duration | The currently configured event duration in minutes |
| DRLC Count | Counter indicating the total number of DRLC commands sent by Demand Manager |
| DRLC Response | Indicates if the device acknowledges the load control command. Example values:<br>DM_DRLC_RESPONSE_ACK    0<br>DM_DRLC_RESPONSE_NONE    1<br>DM_DRLC_RESPONSE_UNKNOWN    255 |
| DRLC Radio ID | Radio ID for the device being controlled |
| DRLC Parameters | Specifies the configured parameters for controlled device. Example values: Load Type, Control Type, Temp Offset/Duty Cycle setting |

The foregoing is provided for purposes of illustrating, describing, and explaining aspects of the present invention and is not intended to be exhaustive or to limit the invention to the precise forms disclosed. Further modifications and adaptation of these embodiments will be apparent to those skilled in the art and may be made without departing from the scope and spirit of the invention. Different arrangements and combinations of the components and functionality described above, as well as those not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent.

What is claimed is:

1. A system for managing consumption of an electrical resource, the system including:
   an electrical meter capable of receiving electricity from an electrical utility provider and providing at least a portion of the received electricity to a load device, wherein a load managing device is capable of adjusting an electrical consumption of the load device, and
   a demand management module having a processor configured with code to perform operations comprising:
      receiving, from the electrical utility provider, information describing a provider demand interval associated with the electrical utility provider;
      based on the received information, modifying a demand interval that is locally stored, such that the local demand interval has (i) a duration and a start time based on the provider demand interval and (ii) a guard time included in the duration of the local demand interval;
      during the guard time of the local demand interval, providing first command data to the load managing device, wherein the load managing device permits an increase in the electrical consumption of the load device during the guard time based on the first command data;
      determining that the portion of the received electricity received by the load device during the guard time of the local demand interval includes an increase in the electrical consumption of the load device;
      determining a forecasted consumption of the load device for a remainder of the local demand interval, the forecasted consumption based on the portion of the received electricity received during the guard time of the local demand interval and on a quantity of time remaining in the duration of the local demand interval;
      based on a comparison of the forecasted consumption to a demand threshold associated with the local demand interval, determining that the forecasted consumption exceeds the demand threshold; and
      responsive to determining that the forecasted consumption exceeds the demand threshold, providing second command data to the load managing device during the local demand interval, wherein the load managing device reduces the electrical consumption of the load device during the remainder of the local demand interval based on the second command data.

2. The system of claim 1, wherein:
the information describing the provider demand interval indicates a billing category of the provider demand interval, and
the demand threshold of the local demand interval is determined based on the billing category.

3. The system of claim 1, wherein determining the forecasted consumption of the load device is based on:
a quantity of electricity previously consumed during the local demand interval,
a length of time of the local demand interval, and
an amount of instantaneous power measured by the electrical meter.

4. The system of claim 1, wherein the processor is further configured for:
providing additional command data to an additional load managing device capable of adjusting an additional electrical consumption of an additional load device;
determining an additional forecasted consumption of the additional load device; and
responsive to determining that the forecasted consumption exceeds the demand threshold, providing the second command data and the additional command data such that a combination of the forecasted consumption and the additional forecasted consumption is within the demand threshold.

5. The system of claim 4, wherein:
the load managing device and the additional load managing device each has a respective priority value; and
the second command data and the additional command data each are based on the respective priority values.

6. The system of claim 1, wherein the load managing device is one of a thermostat or a load control switch.

7. The system of claim 1, wherein the second command data to the load managing device describes a reduction of the electrical consumption by the load device.

8. The system of claim 1, wherein the processor is further configured for:
determining that an additional forecasted consumption of the load device is within the demand threshold, and
responsive to determining that the additional forecasted consumption is within the demand threshold, issuing an additional command to the load managing device, wherein the additional command describes an additional increase of the electrical consumption by the load device.

9. A method for managing consumption of an electrical utility, the method including operations comprising:
receiving, from an electrical utility provider, information describing a provider demand interval having a first duration, the provider demand interval associated with the electrical utility provider;
based on the received information, modifying a demand interval that is locally stored, such that the local demand interval has (i) a second duration and a start time based on the first duration of the provider demand interval and (ii) a guard time included in the second duration of the local demand interval;
receiving information describing a portion of electricity received by a load device, wherein a load managing device is capable of adjusting an electrical consumption of the load device;

during the guard time of the local demand interval, providing first command data to the load managing device, wherein the load managing device permits an increase in the electrical consumption of the load device during the guard time based on the first command data;
determining that the portion of the received electricity is received by the load device during the guard time of the local demand interval includes an increase in the electrical consumption of the load device;
determining a forecasted consumption of the load device for a remainder of the local demand interval, the forecasted consumption based on the portion of the received electricity received during the guard time of the local demand interval and on a quantity of time remaining in the second duration of the local demand interval;
based on a comparison of the forecasted consumption to a demand threshold associated with the local demand interval, determining that the forecasted consumption exceeds the demand threshold; and
responsive to determining that the forecasted consumption exceeds the demand threshold, providing second command data to the load managing device during the local demand interval, wherein the load managing device reduces the electrical consumption of the load device during the remainder of the local demand interval based on the second command data.

10. The method of claim 9, wherein:
the information describing the provider demand interval indicates a billing category of the provider demand interval, and
the demand threshold of the local demand interval is determined based on the billing category.

11. The method of claim 9, wherein determining the forecasted consumption of the load device is based on:
a quantity of electricity previously consumed during the local demand interval,
a length of time of the local demand interval, and
an amount of instantaneous power measured by an electrical meter.

12. The method of claim 9, wherein the operations further comprise:
providing additional command data to an additional load managing device capable of adjusting an additional electrical consumption of an additional load device;
determining an additional forecasted consumption of the additional load device; and
responsive to determining that the forecasted consumption exceeds the demand threshold, providing the second command data and the additional command data such that a combination of the forecasted consumption and the additional forecasted consumption is within the demand threshold.

13. The method of claim 12, wherein:
the load managing device and the additional load managing device each has a respective priority value; and
the second command data and the additional command data each are based on the respective priority values.

14. The method of claim 9, wherein the load managing device is one of a thermostat or a load control switch.

15. The method of claim 9, wherein the second command data to the load managing device describes a reduction of the electrical consumption by the load device.

16. The method of claim 9, wherein the operations further comprise:
- determining that an additional forecasted consumption of the load device is within the demand threshold, and
- responsive to determining that the additional forecasted consumption is within the demand threshold, issuing an additional command to the load managing device, wherein the additional command describes an additional increase of the electrical consumption by the load device.

17. A system for managing electrical consumption of a load device, the system including:
- a load managing device capable of adjusting the electrical consumption of the load device, and
- a processor configured with code to perform operations comprising:
- receiving information describing a quantity of electricity received by the load device from an electrical utility provider;
- determining that the quantity of electricity is received during a local demand interval, wherein the local demand interval has (i) a duration and a start time that are modified based on an additional duration of a provider demand interval associated with the electrical utility provider and (ii) a guard time included in the duration of the local demand interval;
- responsive to receiving first command data during the guard time, increasing the electrical consumption of the load device during the guard time of the local demand interval;
- determining a forecasted consumption of the load device for a remainder of the local demand interval, the forecasted consumption based on the portion increased electrical consumption during the guard time of the local demand interval and on a quantity of time remaining in the duration of the local demand interval;
- based on a comparison of the forecasted consumption to a demand threshold associated with the local demand interval, determining that the forecasted consumption exceeds the demand threshold; and
- responsive to determining that the forecasted consumption exceeds the demand threshold, reducing the electrical consumption of the load device during the remainder of the local demand interval based on second command data received subsequent to the guard time.

18. The system of claim 17, wherein:
- the provider demand interval indicates a billing category of the provider demand interval, and
- the demand threshold associated with the local demand interval is determined based on the billing category.

19. The system of claim 17, wherein adjusting the electrical consumption of the load device includes reducing the electrical consumption of the load device.

20. The system of claim 17, wherein the processor is further configured for:
- determining that an additional forecasted consumption of the load device is within the demand threshold, and
- responsive to determining that the additional forecasted consumption is within the demand threshold, adjusting the electrical consumption of the load device, wherein the adjustment describes an increase of the electrical consumption by the load device.

* * * * *